(12) United States Patent
Kailasam et al.

(10) Patent No.: US 7,341,946 B2
(45) Date of Patent: Mar. 11, 2008

(54) METHODS FOR THE ELECTROCHEMICAL DEPOSITION OF COPPER ONTO A BARRIER LAYER OF A WORK PIECE

(75) Inventors: Sridhar K. Kailasam, Fremont, CA (US); John Drewery, Alameda, CA (US); Jonathan D. Reid, Sherwood, OR (US); Eric G. Webb, Salem, OR (US); Johanes H. Sukamto, Lake Oswego, OR (US)

(73) Assignee: Novellus Systems, Inc., San Jose, CA (US)

( * ) Notice: Subject to any disclaimer, the term of this patent is extended or adjusted under 35 U.S.C. 154(b) by 528 days.

(21) Appl. No.: 10/705,579

(22) Filed: Nov. 10, 2003

(65) Prior Publication Data

US 2005/0098440 A1    May 12, 2005

(51) Int. Cl.
*H01L 21/44*    (2006.01)
(52) U.S. Cl. .................. 438/687; 438/685; 438/686
(58) Field of Classification Search ................. 438/687
See application file for complete search history.

(56) References Cited

U.S. PATENT DOCUMENTS

| | | | |
|---|---|---|---|
| 5,824,599 A * | 10/1998 | Schacham-Diamand et al. | 438/678 |
| 6,214,731 B1 * | 4/2001 | Nogami et al. | 438/687 |
| 6,300,244 B1 * | 10/2001 | Itabashi et al. | 438/678 |
| 6,436,267 B1 * | 8/2002 | Carl et al. | 205/186 |
| 6,486,055 B1 * | 11/2002 | Jung et al. | 438/618 |
| 6,764,950 B2 * | 7/2004 | Noguchi et al. | 438/687 |
| 6,790,776 B2 * | 9/2004 | Ding et al. | 438/685 |
| 7,060,617 B2 * | 6/2006 | Dubin et al. | 438/687 |
| 7,081,370 B2 * | 7/2006 | Kumagai et al. | 438/69 |
| 7,135,404 B2 * | 11/2006 | Baskaran et al. | 438/652 |
| 2002/0076929 A1 * | 6/2002 | Lu et al. | 438/687 |
| 2003/0068887 A1 * | 4/2003 | Shingubara et al. | 438/687 |

OTHER PUBLICATIONS

D. Josell, D. Wheeler, C. Witt, and T.P. Moffat; "Seedless Superfill: Copper Electrodeposition in Trenches with Ruthenium Barriers"; Electrochemical and Solid-State Letters, vol. 6; Jun. 5, 2003; pp. C143-C145.

M.W. Lane, C.E. Murray, F.R. McFeely, P.M. Vereecken and R. Rosenberg; "Liner Materials for Direct Electrodeposition of Cu"; Applied Physics Letters, vol. 83, No. 12; Sep. 22, 2003; pp. 2330-2332.

O. Chyan, T.N. Arunagiri and T. Ponnuswamy; "Electrodeposition of Copper Thin Film on Ruthenium, A Potential Diffusion Barrier for Cu Interconnects"; Journal of the Electrochemical Society, vol. 150; Oct. 8, 2002; pp. C347-C350.

* cited by examiner

*Primary Examiner*—Thao X. Le
*Assistant Examiner*—Colleen E. Rodgers
(74) *Attorney, Agent, or Firm*—Ingrassia Fisher & Lorenz, P.C.

(57) ABSTRACT

Methods are provided for electrochemically depositing copper on a work piece. One method includes the step of depositing overlying the work piece a barrier layer having a surface and subjecting the barrier layer surface to a surface treatment adapted to facilitate deposition of copper on the barrier layer. Copper then is electrochemically deposited overlying the barrier layer.

19 Claims, 1 Drawing Sheet

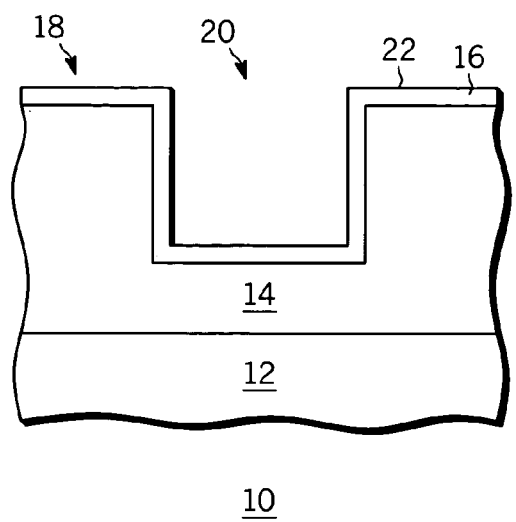
FIG. 1
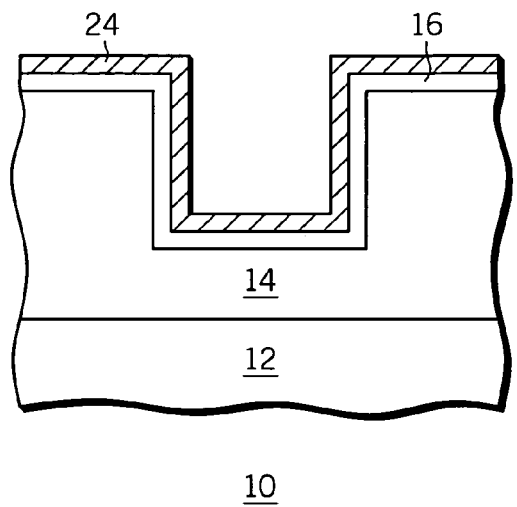
FIG. 3
FIG. 2
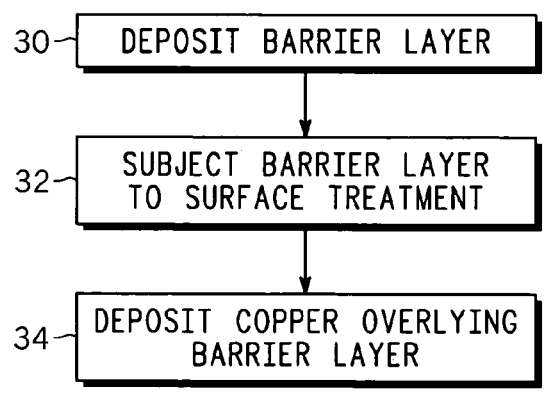

METHODS FOR THE ELECTROCHEMICAL DEPOSITION OF COPPER ONTO A BARRIER LAYER OF A WORK PIECE

TECHNICAL FIELD

The present invention generally relates to the electrochemical deposition of a metal, and more particularly relates to electrochemical deposition of copper directly onto a barrier layer of a work piece.

BACKGROUND

The production of integrated circuits begins with the creation of high-quality semiconductor wafers. During the wafer fabrication process, the wafers may undergo multiple dielectric and conductor deposition processes followed by the masking and etching of the deposited layers. Some of these steps relate to metallization, which generally refers to the materials, methods, and processes of wiring together or interconnecting the component parts of an integrated circuit located on or overlying the surface of the wafer. Typically, the wiring of an integrated circuit involves etching features, such as "trenches" and "vias," in a planar dielectric (insulator) layer and filling the features with a conductive material, typically a metal.

In the past, aluminum was used extensively as a metallization material in semiconductor fabrication due to the ease with which aluminum could be applied and patterned on the wafer. In addition, aluminum metallization does not suffer from the leakage and adhesion problems experienced with the use of gold. Other metallization materials have included such materials as Ni, Ta, Ti, W, Ag, Al(Cu), TaN, TiN, CoWP, NiP and CoP, alone or in various combinations.

Recently, techniques have been developed which utilize copper to form conductive contacts and interconnects because copper is less susceptible to electromigration and exhibits a lower resistivity than aluminum. Since copper does not readily form volatile compounds, the plasma etching of copper is difficult. Hence, conductive contacts and interconnects often are formed using a damascene process. In accordance with the damascene process, the copper conductive contacts and interconnects are usually formed by etching features such as vias and/or trenches within a blanket insulating material. The vias and/or trenches may be formed wholly within one insulating material layer or may be etched to expose other insulating material layers or metallic layers. A barrier layer, which serves to prevent catastrophic contamination caused by copper diffusing through the interlayer dielectrics, typically may be deposited onto the surface of the insulating material and within the vias and/or trenches. Because it is often difficult to form a copper metallization layer directly overlying the barrier layer using electroplating, a seed layer of copper may be deposited onto the barrier layer. Then, a copper metallization layer may be electrodeposited onto the seed layer to fill the vias and/or trenches. The excess copper metallization layer, the copper seed layer, and the barrier layer overlying the insulating material outside the vias and/or trenches then may be removed, for example, by a process of chemical mechanical planarization or chemical mechanical polishing, each of which will hereafter be referred to as chemical mechanical planarization or CMP.

Tantalum (Ta), tantalum nitride (TaN), and titanium nitride (TiN) currently are used as barrier layers in copper interconnects. However, it is difficult to electroplate copper directly onto thin barrier layers of Ta, TaN, and TiN because these barrier materials are highly resistive. Further, Ta, TaN, and TiN have a tendency to form an oxide film that is difficult to remove. This oxide film may prevent sufficient adhesion of the copper to the work piece. Accordingly, it is typically necessary to deposit a seed layer overlying the barrier layer to facilitate the deposition of copper. However, poor sidewall coverage and large overhang of the copper seed layer in the features may cause the copper electrofill to close off and leave voids in the features. As integrated circuits continue to scale to 90 nm, 65 nm, 45 nm and smaller technology nodes, it may become difficult to further decrease the dimensions of the barrier layer and seed layer in higher-aspect ratio features. This decrease is needed to allow for void-free filling with copper.

Barrier layers formed of ruthenium may present a desirable alternative to Ta, TaN, and TiN barriers. Ruthenium is an air-stable transition metal with a high melting point and is at least ten times more electrically conductive than tantalum. In addition, ruthenium generally shows negligible solid solubility with copper, thereby minimizing the adverse increase in the resistivity of copper from dissolution of dopants in the copper. Further, copper demonstrates suitable adhesion to ruthenium when directly deposited thereon. However, ruthenium demonstrates a tendency to form a ruthenium oxide layer overlying the ruthenium layer when exposed to ambient conditions. This ruthenium oxide layer may interfere with the deposition of copper directly onto the ruthenium layer.

Accordingly, it is desirable to provide a method for the electrochemical deposition of copper directly on a barrier layer of a semiconductor substrate. In addition, it is desirable to provide a method for the deposition of copper on a semiconductor work piece wherein the method eliminates the need for the deposition of a seed layer overlying the barrier layer. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements, and FIG. 1. is a cross-sectional view of a portion of a work piece having a barrier layer formed thereon;

FIG. 2 is a flow chart illustrating the methods for the electrochemical deposition of copper onto a barrier layer in accordance with the present invention; and FIG. 3 is a cross-sectional view of the portion of the work piece of FIG. 1 having a protective layer overlying the barrier layer.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The invention disclosed and claimed herein is applicable to the deposition of metal onto a surface of a variety of work pieces, but will be described and illustrated with reference to only a single illustrative work piece, namely a semiconductor wafer having an insulating layer deposited thereon.

Although the invention is illustrated with reference to its application only to one particular work piece and to one particular metal deposited on that work piece, it is not intended that the invention be limited to that particular application.

In particular, the present invention is directed to a method for electrochemical deposition of copper on a work piece. As used herein, unless otherwise specified, the term electrochemical deposition includes' both the processes of electroplating and electrochemical mechanical deposition, also known as planar deposition. Electroplating typically involves conventional metal deposition using an electrolyte solution containing a metal, an anode, and a cathode. A polishing step, typically a chemical mechanical polishing step, may be performed during or after deposition to obtain a planar surface of desired thickness. Electrochemical mechanical deposition uses a dedicated apparatus that selectively deposits the metal on the work piece to obtain a planar metal surface of a desired thickness.

In accordance with various embodiments of the present invention, the methods of electrochemical deposition of copper on a work piece include the electrochemical deposition of copper onto a work piece 10, such as that illustrated in FIG. 1, that typically includes a semiconductor substrate 12, such as a silicon substrate. Substrate 12 may comprise one layer or multiple layers and can include circuitry, such as transistors, digital circuitry, and sense amplifiers, which circuitry has not been shown for simplicity. A layer of insulating material 14 overlies substrate 12. The insulating layer may be a single layer of insulating material or may be composed of a plurality of layers of insulating material, not all of which are necessarily the same material. The layer of insulating material 14 may be or may include, for example, silicon dioxide, silicon nitride, or any of the other insulating materials commonly used in the fabrication of semiconductor devices. In accordance with one embodiment of the invention, the layer of insulating material may include a layer of "low-k dielectric material" such as CORAL™ low-k dielectric material, provided by Novellus Systems, Inc. of San Jose, Calif. and formed by chemical vapor deposition. The term "low-k dielectric material" means a material having a dielectric constant less than about 3.9. While work piece 10 is illustrated in FIG. 1 having a layer of insulating material 14 directly overlying substrate 12, it will be understood that any number of layers of insulating or metallic materials may be formed overlying substrate 12 before formation of insulating material layer 14.

The work piece 10 may also have a field region 18 that is adjacent to a feature 20. As used herein, a feature is any sub-surface element, character or surface such as, but not limited to, a via or trench formed within work piece 10. The features can be formed by conventional photolithographic and etching techniques. The surface of layer 14 surrounding feature 20 is called the field region 18. Field region 18 is any adjacent element, character or surface that is elevated with respect to the features. The field region is generally, but not necessarily, substantially planar in contrast to the features. Features formed during the processing of a semiconductor work piece can be of varying sizes, such as those having widths ranging from less than 100 nm to widths of several hundred microns. Feature 20 may be formed wholly within insulating material layer 14 or may be formed within insulating material layer 14 and any other layer(s) that has been formed between substrate 12 and insulating material layer 14. In one exemplary embodiment of the invention, feature 20 may be a via or a trench that has been etched to expose a metallic layer formed overlying substrate 12 and underlying insulating material layer 14.

Formed within feature 20 and overlying layer of insulating material 14 is a barrier layer 16. Barrier layer 16 can be formed of any suitable material that prevents or minimizes the diffusion of copper into insulating material layer 14 and that permits or facilitates the deposition of copper within feature 20 without the need for a seed layer, such as a copper seed layer. In addition, barrier layer 16 can be formed of any suitable material that exhibits suitable adhesion to the surfaces of feature 20 and thus is able to withstand delamination from feature 20 upon electrochemical mechanical deposition or chemical mechanical planarization (CMP). Examples of materials suitable for forming barrier layer 16 include ruthenium, cobalt, molybdenum, tungsten, rhodium, palladium, osmium, rhenium, iridium, and platinum. In a preferable embodiment of the present invention, barrier layer 16 is formed of ruthenium. Barrier layer 16 can be formed by physical vapor deposition (PVD), chemical vapor deposition (CVD), atomic layer deposition (ALD), electroless deposition, or any other suitable deposition method and can be formed to a thickness, for example, in the range of about 1 to 100 nm, preferably in the range of 1 to 15 nm.

Referring to FIGS. 1 and 2, methods for electrochemical deposition of copper overlying barrier layer 16, in accordance with the various embodiments of the present invention, include depositing barrier layer 16 overlying insulating material layer 14 and within feature 20, step 30, and subjecting a surface 22 of barrier layer 16 to a surface treatment that is adapted to facilitate the deposition of copper on barrier layer 16, step 32. After subjecting barrier layer 16 to the surface treatment, a copper metallization layer may be deposited onto barrier layer 16 and within feature 20, step 34.

As illustrated in FIG. 3, in accordance with one embodiment of the invention, surface 22 may be subjected to a surface treatment that results in the formation of a protective layer 24 overlying barrier layer 16. Protective layer 24 may be formulated to prevent or minimize the oxidation of barrier layer 16, thus preventing or minimizing the formation of an oxide layer overlying barrier layer 16 that may interfere with the subsequent deposition of copper overlying barrier 16. Protective layer 24 may also prevent or minimize the deposition of other contaminants on barrier layer 16 that may interfere with the deposition of a copper layer on barrier layer 16.

In accordance with one exemplary embodiment of the invention, protective layer 24 may be formed from silane or diborane or other like chemicals. In another exemplary embodiment of the invention, protective layer 24 may be formed from a sulfur-containing gas, a nitrogen-containing gas and/or a phosphorous-containing gas. Protective layer 24 can be formed by chemical vapor deposition (CVD), atomic layer deposition (ALD) or any other suitable deposition process to a thickness, for example, of no greater than about 20 angstroms, preferably no greater than about 10 angstroms. Protective layer 24 may be maintained on barrier layer 16 for as long as protection from oxidation and/or contamination is needed and then may be removed prior to the deposition of copper overlying barrier layer 16. Protective layer 24 may be removed by any suitable etchant. Preferably, the etchant is formulated to remove protective layer 24 but does not etch, or does not significantly etch, barrier layer 16. Examples of suitable etchants include, for example, sulfuric acid, nitric acid, a combination of hydrogen peroxide and sulfiric acid, and the like. Alternatively, protective layer 24 may be removed by exposure to a copper plating solution that is formulated to remove protective layer 24 and to deposit copper on barrier layer 16.

In accordance with exemplary embodiment of the present invention, protective layer 24 may be formed in the same processing apparatus as used to form barrier layer 16 to prevent or minimize the oxidation of barrier layer 16 by exposure to the ambient environment and to prevent or minimize the contamination of barrier layer 16 by contaminants that may interfere with the subsequent deposition of a copper layer over barrier layer 16. For example, a barrier layer 16 may be deposited within feature 20 in a CVD chamber. After the formation of barrier layer 16, the CVD chamber may be flushed of the gases used to form barrier layer 16 and gases to form protective layer 24 may be introduced into the chamber. Chemical vapor deposition may then proceed to form protective layer 24. In this manner, barrier layer 16 is not exposed to oxygen or other contaminants present in the ambient environment. In an alternative embodiment of the present invention, protective layer 24 may be formed in a chamber separate from but connected to the chamber used to form barrier layer 16 such that, upon transfer from the first chamber to the second chamber, protective layer 24 is not exposed to the ambient environment. In another embodiment of the present invention, protective layer 24 may be formed in a processing apparatus separate from the processing apparatus used to form barrier layer 16 but exposure of barrier layer 16 to the ambient environment is prevented or minimized by, for example, limiting the amount of time barrier layer 16 is exposed to the ambient environment or by transferring work piece 10 by means so that barrier layer 16 is otherwise not exposed to the ambient environment.

In accordance with another exemplary embodiment of the present invention, protective layer 24 may comprise copper. Copper protective layer 24 may be formed by CVD, ALD, PVD (including, but not limited to, planar-magnetron PVD and ionized PVD), or any other suitable deposition method. Preferably, copper protective layer 24 is deposited to a thickness sufficient to protect barrier layer 16 from oxidation or contamination due to exposure to ambient conditions but is not grown beyond that thickness. Growth beyond this thickness (such as that necessary to form a copper seed layer) is not necessary as barrier layer 16 is formed of a material that permits or facilitates the nucleation of copper thereon. Preferably, copper protective layer 24 is grown to a thickness no greater than about 20 angstroms. More preferably, copper protective layer 24 is grown to a thickness no greater than about 10 angstroms. In addition, it is not necessary to remove copper protective layer 24 prior to the electrochemical deposition of copper.

In accordance with an exemplary embodiment of the present invention, copper protective layer 24 may be formed in the same processing apparatus as used to form barrier layer 16 to prevent or minimize the oxidation of barrier layer 16 by exposure to the ambient environment and to prevent or minimize the contamination of barrier layer 16 by contaminants that may interfere with the subsequent deposition of a copper layer over barrier layer 16. For example, a barrier layer 16 may be deposited within feature 20 in a CVD chamber. After the formation of barrier layer 16, the CVD chamber may be flushed of the gases used to form barrier layer 16 and a copper-containing precursor along with reactant gases to form copper protective layer 24 may be introduced into the chamber. Chemical vapor deposition then may proceed to form copper protective layer 24. In this manner, barrier layer 16 is not exposed to oxygen or other contaminants present in the ambient environment. In an alternative embodiment of the present invention, copper protective layer 24 may be formed in a chamber separate from but connected to the chamber used to form barrier layer 16 such that, upon transfer from the first chamber to the second chamber, barrier layer 16 is not exposed to the ambient environment. In another embodiment of the present invention, copper protective layer 24 may be formed in a processing apparatus separate from the processing apparatus used to form barrier layer 16 but exposure of barrier layer 16 to the ambient environment is prevented or minimized by, for example, limiting the amount of time barrier layer 16 is exposed to the ambient environment or by transferring work piece 10 by means so that barrier layer 16 is otherwise not exposed to the ambient environment.

Referring again, to FIG. 1, in accordance with another embodiment of the invention, prior to the electrochemical deposition of copper overlying the barrier layer 14, surface 22 may be subjected to a surface treatment that removes any oxide or contaminants thereon prior to electrochemically depositing copper on barrier layer 16. In one exemplary embodiment of the present invention, surface 22 may be subjected to an acidic solution that is formulated to remove any oxide and/or contaminant from surface 22 of barrier layer 16. Examples of acidic solutions suitable for removing any oxide and/or contaminant from surface 22 includes, but is not limited to, sulfuric acid solutions, nitric acid solutions, hydrochloric acid solutions, aquaregia (nitrohydrochloric acid) solutions, and combinations thereof. Preferably, the acidic solutions comprise an acidic concentration of about ten percent (10%) to about sixty percent (60%) by weight, although it will be understood that any suitable acidic concentration may be used to form the acidic solutions.

After removal of any oxide or contaminant(s) from barrier layer 16, work piece 10 then may be rinsed in de-ionized water, dried, and placed in a processing unit for the electrochemical deposition of copper overlying barrier layer 16. Exposure of barrier layer 16 to the ambient environment may be prevented or minimized by, for example, limiting the amount of time barrier layer 16 is exposed to the ambient environment. Preferably, barrier layer 16 is exposed to the ambient environment for no more than one minute. Exposure of barrier layer 16 to the ambient environment also may be prevented or minimized by transferring work piece 10 by means so that barrier layer 16 is otherwise not exposed to the ambient environment.

In another exemplary embodiment of the present invention, prior to the electrochemical deposition of copper overlying barrier layer 14, surface 22 may be subjected to a surface treatment that exposes barrier layer 16 to an alkaline solution that is formulated to remove any oxide and/or contaminant from surface 22 of barrier layer 16. In a preferred embodiment of the invention, the alkaline solution also may be formulated to remove a portion of barrier layer 16 at surface 22 to ensure that at least a substantial portion of the oxide and/or contaminants have been removed. Preferably, no more than about 10 angstroms of barrier layer 16 is removed. Examples of alkaline solutions suitable for removing any oxide and/or contaminant from surface 22 includes, but is not limited to, alkali metal chlorites, such as sodium hypochlorite, potassium hypochlorite, sodium chlorite, potassium chlorate, sodium perchlorate, potassium perchlorate, manganates such as potassium permanganate, and the like.

After removal of any oxide or contaminant(s) from barrier layer 16, work piece 10 then may be rinsed in de-ionized water, dried, and placed in a processing unit for the electrochemical deposition of copper overlying barrier layer 16.

Exposure of barrier layer 16 to the ambient environment may be prevented or minimized by, for example, limiting the amount of time barrier layer 16 is exposed to the ambient environment or by transferring work piece 10 by means so that barrier layer 16 is otherwise not exposed to the ambient environment.

In a further exemplary embodiment of the invention, prior to the deposition of copper overlying barrier layer 14, surface 22 may be subjected to an alkaline solution, such as that described above, that is formulated to remove any oxide and/or contaminant from surface 22 of barrier layer 16 and then may be subjected to an acidic solution that is formulated to remove any ions and/or other contaminants that may result from exposure to the alkaline solution and that cannot be removed by a rinse in de-ionized water. In an alternative embodiment, prior to the deposition of copper overlying barrier layer 14, surface 22 may be subjected to an acidic solution, such as that described above, that is formulated to remove any oxide and/or contaminant from surface 22 of barrier layer 16 and then may be subjected to an alkaline solution that is formulated to remove any ions and/or other contaminants that may result from exposure to the acidic solution and that cannot be removed by a rinse in de-ionized water.

In another exemplary embodiment of the present invention, prior to the deposition of copper overlying barrier layer 14, surface 22 may be subjected to a surface treatment that comprises applying an anodic current pulse to surface 22 to desorb or dissolve any oxide and/or contaminants that may interfere with the deposition of copper. Using this method, work piece 10 may be place in a copper plating solution and current may be applied such that work piece 10 is made an anode. The anodic current may have a magnitude and may be applied to surface 22 for a period that are sufficient to remove the oxide and/or contaminants. Preferably, the anodic current has a magnitude in the range of about 1 to about 50 mA/cm$^2$ and, more preferably, has a magnitude of about 10 mA/cm$^2$ and is applied for about 0.5 seconds to 10 seconds, more preferably no more than about 2 seconds. After application of the anodic current pulse, work piece 10 may remain in the copper plating solution and a suitable cathodic current may be applied to surface 22 to commence the electrochemical deposition of copper overlying the now-clean barrier layer 16.

In yet another exemplary embodiment of the present invention, prior to the deposition of copper overlying barrier layer 14, surface 22 may be subjected to a surface treatment that comprises applying to surface 22 for a short period of time an initial cathodic current pulse having a high magnitude relative to the initial magnitude of the cathodic current utilized for the electrochemical deposition of the copper layer. In one embodiment of the present invention, the initial cathodic current pulse has a magnitude of about 25 to 200 mA/cm$^2$, preferably a magnitude of about 50 mA/cm$^2$. The initial cathodic current pulse is applied for a period in the range of about 0.5 to about 10 seconds, preferably about 0.5 to about 3 seconds. The cathodic current then may be suitably reduced and applied to commence the electrochemical deposition of copper overlying barrier layer 16. Without being bound by theory, it is believed that the application of a relatively high-magnitude initial cathodic current pulse for a short period of time may result in liberation of atoms from barrier layer 16 due to the reduction of any oxide on barrier layer 16, thus ensuring the removal of at least a significant portion of any oxide on surface 22 of barrier layer 16. It also is possible that the application of a relatively high-magnitude initial cathodic current pulse for a short period of time may serve to free surface 22 of barrier layer 16 of contaminants that may be present on surface 22 and/or may serve to improve copper nucleation allowing for more uniform copper deposition. In one exemplary embodiment of the present invention, an initial cathodic current pulse having a magnitude of 25-200 mA/cm$^2$ may be applied to surface 22 for about 0.5 to 3 seconds and the cathodic current then may be reduced to a magnitude of about 1 to about 10 mA/cm$^2$ to initiate copper deposition. The cathodic current then may be increased, either in steps or by gradual increase, as needed to complete deposition with a magnitude of about 25-200 mA/cm$^2$.

In a further embodiment of the present invention, an anodic current may be applied to surface 22 followed by an initial cathodic current pulse. For example, an anodic current having a magnitude of about 10 mA/cm$^2$ may be applied to surface 22 of work piece 10, as described above, for a period about 1 second to 10 seconds. Application of the anodic current may be followed by the application of an initial cathodic current pulse, such as that described above, having a magnitude of about 25-200 mA/cm$^2$ and applied for a period of about 0.5 to 3 seconds. The cathodic current then may be reduced to a magnitude of about 1 to about 10 mA/cm$^2$ to initiate copper electrochemical deposition. The cathodic current then may be increased, either in steps or by gradual increase, as needed to complete copper deposition.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for depositing copper overlying a work piece, the method comprising the steps of:
   depositing overlying the work piece a barrier layer having a surface;
   forming a protective layer that overlies said surface of said barrier layer and that inhibits oxidation of said surface, wherein said protective layer is formed by exposing said barrier layer to diborane, a sulfur-containing gas, or a phosphorous-comprising gas;
   removing said protective layer; and
   after removing said protective layer, electrochemically depositing copper overlying said barrier layer.

2. The method of claim 1, wherein the step of electrochemically depositing comprises depositing by electroplating or depositing by electrochemical mechanical deposition.

3. The method of claim 1, wherein the step of depositing overlying a work piece a barrier layer comprises depositing overlying the work piece a layer comprising a material selected from the group consisting of ruthenium, cobalt, molybdenum, tungsten, rhodium, palladium, osmium, rhenium, iridium, and platinum.

4. The method of claim 1, wherein the step of forming a protective layer comprises forming a protective layer having a thickness no greater than about 20 angstroms.

5. The method of claim 1, wherein the step of removing said protective layer comprises the step of removing said protective layer using an etchant.

6. The method of claim 5, wherein the step of removing said protective layer using an etchant comprises the step of exposing said protective layer to a solution formed of sulfuric acid, nitric acid, or a combination of sulfuric acid and hydrogen peroxide.

7. The method of claim 1, wherein the step of removing said protective layer comprises the step of removing said protective layer using a copper plating solution.

8. The method of claim 1, wherein the step of depositing a barrier layer comprises the step of forming a barrrier layer by a process selected from the group comprising CVD, ALD, PVD, and electroless deposition.

9. The method of claim 1, wherein the step of depositing a barrier layer and the step of forming a protective layer are performed in the same processing apparatus.

10. The method of claim 9, wherein the step of depositing a barrier layer and the step of forming a protective layer are performed in the same processing chamber of a processing apparatus.

11. A method for depositing copper overlying a work piece, the method comprising the steps of:

depositing overlying the work piece a barrier layer having a surface;

removing from said surface of said barrier layer a contaminant, an oxide, or both by applying to said surface of said barrier layer an initial cathode current pulse of no less than about 25 mA/cm$^2$ for about 0.5 to about 10 seconds; and after the step of applying to said surface of said barrier layer an initial cathode current pulse, electrochemically depositing copper overlying said barrier layer.

12. The method of claim 11, wherein an anodic current is applied to said surface of said barrier layer before the step of applying to said surface of said barrier layer an initial cathodic current pulse.

13. The method of claim 11, wherein the step of electrochemically depositing comprises depositing by electroplating or depositing by electrochemical mechanical deposition.

14. The method of claim 11, wherein the step of depositing overlying a work piece a barrier layer comprises depositing overlying the work piece a layer of material selected from the group comprising ruthenium, cobalt, molybdenum, tungsten, rhodium, palladium, osmium, rhenium, iridium, and platinum.

15. The method of claim 11, wherein the step of depositing a barrier layer comprises the step of forming a barrier layer by a process selected from the group comprising CVD, ALD, PVD, and electroless deposition.

16. A method for depositing copper overlying a work piece, the method comprising the steps of:

depositing overlying the work piece a barrier layer having a surface;

forming a protective layer that overlies said surface of said barrier layer and that inhibits oxidation of said surface, wherein said protective layer is formed by exposing said surface to a sulfur-containing gas, a phosphorous-containing gas, or a combination thereof; and after forming said protective layer, electrochemically depositing copper overlying said barrier layer.

17. The method of claim 16, wherein the step of electrochemically depositing comprises at least one of depositing by electroplating and depositing by electrochemical mechanical deposition.

18. The method of claim 16, wherein the step of depositing overlying a work piece a barrier layer comprises depositing overlying the work piece a layer of material selected from the group comprising ruthenium, cobalt, molybdenum, tungsten, rhodium, palladium, osmium, rhenium, iridium, and platinum.

19. The method of claim 16, wherein the step of depositing a barrier layer comprises the step of forming a barrier layer by a process selected from the group comprising CVD, ALD, PVD, and electroless deposition.

* * * * *